TRANSISTOR AMPLIFIER CIRCUIT HAVING DIODE TEMPERATURE COMPENSATION

Filed May 11, 1966

INVENTOR:
RICHARD C. WEISCHEDEL,
BY Norman C. Fulmer
HIS ATTORNEY.

United States Patent Office 3,452,281
Patented June 24, 1969

3,452,281

TRANSISTOR AMPLIFIER CIRCUIT HAVING DIODE TEMPERATURE COMPENSATION

Richard C. Weischedel, Camillus, N.Y., assignor to General Electric Company, a corporation of New York Filed May 11, 1966, Ser. No. 549,266
Int. Cl. H03f *1/30, 3/10*
U.S. Cl. 330—24 1 Claim

ABSTRACT OF THE DISCLOSURE

A circuit is disclosed for providing temperature compensation for a transistor by means of a diode connected in a biasing circuit for the input electrode of the transistor, without adversely affecting the input signal impedance of the circuit. Proper current for the diode is achieved by a resistor network having a pair of series-connected resistors connected in parallel with a third resistor. The junction of the pair of resistors is connected to the signal input electrode of the transistor, for applying temperature-compensated bias thereto. The resistance values of the pair of resistors is chosen to provide a desired input signal impedance, and the value of the third resistor is chosen, in conjunction with that of the pair of resistors, to provide proper current in the temperature-compensating diode.

Figure 1:
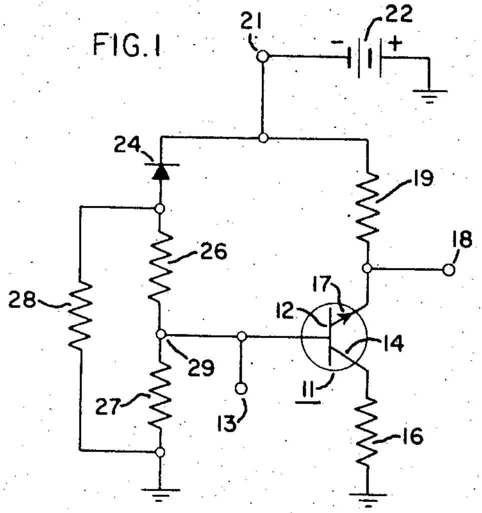

This invention relates to amplifier circuits, and particularly to temperature-compensated transistor amplifier-circuits.

The term "amplifier" as used herein is employed in a broad sense, so as to include oscillators, emitter follower circuits, etc., which function in the manner of an amplifier although not necessarily amplifying a signal.

Temperature compensation is employed in transistor amplifier circuits where it is desired that the functioning thereof be unaffected by changes in temperature. A conventional way of achieving this, in a transistor amplifier wherein current flows in a path through one or more junctions of the transistor, is to provide a second current path, in parallel with the transistor current path, which incorporates a diode device having temperature characteristics similar to that of the transistor. A point in this parallel path is connected to an electrode of the transistor to provide a temperature-affected bias voltage thereto. Thus, when the voltage at the output electrode of the transistor tends to increase or decrease due to change in temperature, the aforesaid bias voltage will also increase or decrease in a manner tending to stabilize the output electrode voltage with respect to temperature.

Frequently the transistor electrode to which the temperature-affected bias is connected, functions as the signal input electrode of the transistor. In this event, a compromise must be made between the usual desirability of having a relatively high signal input impedance at the signal input electrode, and the desirability of having a relatively lower impedance value in order to achieve optimum temperature stability. Therefore, it is customary to have optimum temperature stabilization at the expense of optimum input impedance, or else optimum input impedance at the expense of optimum temperature stabilization, or to accept a compromise in which neither of the foregoing is optimized.

An object of the invention is to provide an improved temperature compensated transistor amplifier circuit.

Another object is to provide a temperature compensated amplifier circuit having optimum temperature compensation characteristics and also having optimum signal input impedance.

Other objects will be apparent from the following description and claims, and from the accompanying drawing.

The invention comprises, basically and in a preferred embodiment, a transistor amplifier circuit providing a current path through one or more junctions of a transistor, and a second current path including a diode device and connected in parallel with the first-mentioned current path. The second current path includes two resistors in series, the junction thereof being connected to a signal input electrode of the transistor. In accordance with the invention, the aforesaid two series resistors have values of resistance to provide optimum signal input impedance for the amplifier. This will usually be a relatively high impedance. Further in accordance with the invention, an additional resistor is connected in parallel with the aforesaid series resistors, this additional resistor having a value of resistance to cause optimum current flow through the diode device for providing temperature stabilization of the amplifier circuit.

Figure 2:
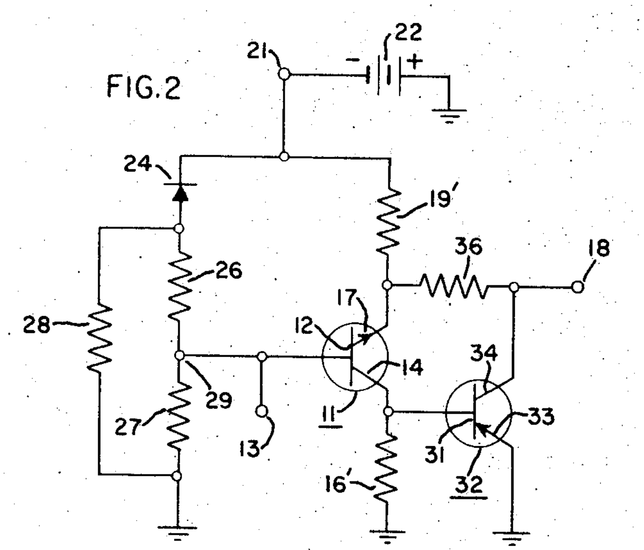

In the drawing, FIGURE 1 is an electrical schematic diagram of a preferred embodiment of the invention, and FIGURE 2 is an electrical schematic diagram of an alternative preferred embodiment of the invention.

In FIGURE 1, an amplifier transistor 11 has a base electrode 12 thereof connected to a signal input terminal 13, a collector electrode 14 connected to electrical ground via a resistor 16, and an emitter electrode 17 connected to a signal output terminal 18 and also connected, via a load resistor 19, to a current supply terminal 21. A battery 22 or other suitable operating voltage source is connected between the terminal 21 and electrical ground.

A diode device 24 and a pair of resistors 26 and 27 are connected in series between the current terminal 21 and electrical ground. An additional resistor 28 is connected across and in parallel with the pair of resistors 26 and 27. The junction 29 of resistors 26 and 27 is connected to the base electrode 12 of transistor 11.

The circuit functions as follows. Electron circuit flows from the current terminal 21 through the load resistor 19, the emitter-base and base-collector junctions of the transistor 11, and the resistor 16 (which is employed, if desirable, to provide a bias voltage for the collector electrode 14), to electrical ground. A replica of an input signal applied to input signal terminal 13 occurs at the signal output terminal 18. Since this circuit is a so-called emitter follower, the output signal will be of slightly less amplitude than the input signal. Electron current also flows in a path from the current terminal 21 through the diode device 24 and the network of resistors 26, 27, and 28 to electrical ground. The diode device 24, which may be a semiconductor diode, or the base-emitter junction of a transistor or other suitable device, has a temperature characteristic so related or identical to that of the transistor 11, that when the voltage at the output terminal 18 tends to change due to temperature effects in the transistor 11, a corresponding voltage change with respect to temperature occurs at the resistor junction 29, and, being applied to the base input electrode 12, counteracts the temperature effect thereby stabilizing the voltage at the signal output terminal 18. The ratio of values of resistors 26 and 27 is such as to provide the correct operating bias voltage at the base electrode 12. In accordance with the invention, the actual resistance values of the resistors 26 and 27 are chosen to provide the optimum desired value of signal input impedance at the signal input terminal 13. This will usually be a relatively high value of resistance. Further in accordance with the invention, the resistor 28 is given a value to insure a proper amount of current flow through the diode device 24 in order to provide optimum temperature stabilization. Thus, the objects of the invention are achieved by the foregoing simple and inexpensive circuitry. Furthermore, in addition to achieving simultaneously the optimum temperature compensation characteristics and signal input impedance, the invention also permits substantially independent adjustment, if so desired, of signal input impedance and temperature stabilization optimization.

The elements of FIGURE 2, insofar as they are similar to FIGURE 1, are given the same reference numerals as in FIGURE 1. In the circuit of FIGURE 2, the transistor 11 does not function as an emiter follower as in FIGURE 1, but instead functions as an amplifier having a collector output electrode; the resistor 16′ functions as the output load resistor; and resistor 19′ functions in a feedback network. The collector electrode 14 is connected to a base electrode 31 of a signal amplifying transistor 32. The transistor 32 has an emiter electrode 33 connected to electrical ground, and a collector electrode 34 connected to the signal output terminal 18. A feedback resistor 36 is connected between the collector electrode 34 and the emitter electrode 17 of the first transistor 11. As is the case with the circuit of FIGURE 1 described above, the resistors 26 and 27 provide optimum signal input impedance, and the resistor 28 provides optimum temperature stabilization of the amplifier circuit. The temperature stabilization stabilizes the voltage at the emitter electrode 17, thereby stabilizing the feedback circuit and hence stabilizing the entire amplifier.

While preferred embodiments of the invention are shown and described, various other embodiments and modifications thereof will become apparent to persons skilled in the art and will fall within the scope of invention as defined in the following claim.

What I claim is:

1. In a temperature compensating bias circuit for a transistor amplifier circuit having a first direct current path through one or more junctions of a transistor connected as an amplifier, and having a second direct current path consisting of a diode device and a pair of resistors connected in series between a direct current source and a point of reference potential, said first direct current path being connected in parallel with said second direct current path, said diode device being polarized for current flow in the forward direction with respect to said source, and the junction of said pair of resistors being directly connected to a signal input electrode for providing temperature stabilization of said transistor amplifier, the improvement comprising an additional resistor having a first terminal connected to the junction of said pair of resistors and said diode device and a second terminal directly connected to said point of reference potential and having a value of resistance to provide a direct current through said diode device to achieve optimum temperature stabilization of the amplifier circuit, said pair of resistors having values of resistance for establishing the signal input impedance of the amplifier circuit.

References Cited

UNITED STATES PATENTS

| | | | |
|---|---|---|---|
| 2,854,606 | 9/1958 | Spiegel ---------- | 330—129 X |
| 3,247,363 | 4/1966 | Jenkins ------------- | 330—24 |
| 3,304,510 | 2/1967 | Elrod et al. ---------- | 330—24 |

ROY LAKE, *Primary Examiner.*

LAWRENCE J. DAHL, *Assistant Examiner.*

U.S. Cl. X.R.

330—22, 23